United States Patent
Kodama et al.

(10) Patent No.: US 10,466,306 B2
(45) Date of Patent: Nov. 5, 2019

(54) METHOD OF MANUFACTURING BATTERY PACK

(71) Applicant: TOYOTA JIDOSHA KABUSHIKI KAISHA, Toyota-shi, Aichi-ken (JP)

(72) Inventors: Kazuya Kodama, Tajimi (JP); Masahiko Mitsui, Toyota (JP); Junta Izumi, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 194 days.

(21) Appl. No.: 15/655,367

(22) Filed: Jul. 20, 2017

(65) Prior Publication Data
US 2018/0045785 A1 Feb. 15, 2018

(30) Foreign Application Priority Data
Aug. 15, 2016 (JP) .................. 2016-159111

(51) Int. Cl.
*G01R 31/36* (2019.01)
*G01R 31/385* (2019.01)
(Continued)

(52) U.S. Cl.
CPC ....... *G01R 31/3865* (2019.01); *G01R 31/392* (2019.01); *H01M 2/1022* (2013.01);
(Continued)

(58) Field of Classification Search
CPC .. G01R 31/3865; H01M 10/48; H01M 4/485; H01M 10/0459; H01M 2010/4271;
(Continued)

(56) References Cited

U.S. PATENT DOCUMENTS

| 4,837,119 A | 6/1989 | Ikoma et al. |
| 5,642,032 A | 6/1997 | Kokuga |

(Continued)

FOREIGN PATENT DOCUMENTS

| JP | S64-57568 A | 3/1989 |
| JP | H8-69820 A | 3/1996 |

(Continued)

OTHER PUBLICATIONS

Fox, C., Coates, D., Ansley, R., Cooper, S. and Morgan, J., The design and manufacture of nickel-hydrogen batteries for spacecraft power systems. In 16th International Communications Satellite Systems Conference (p. 1023). (Year: 1996).*

*Primary Examiner* — Christopher P McAndrew
(74) *Attorney, Agent, or Firm* — Sughrue Mion, PLLC

(57) ABSTRACT

(A) A used battery pack is prepared. (B) By disassembling the used battery pack, a cell etc. is collected from the used battery pack. The cell etc. are a nickel-metal hydride battery. (C) A state of charge of the collected cell etc. is adjusted to a state of charge within any of a first SOC range (0 to 3%), a second SOC range (3 to 20%), and a third SOC range (100 to 200%). (G) An amount of voltage lowering as a result of the cell etc. being left is calculated. (H) When the amount of voltage lowering is equal to or smaller than a reference value set in advance, the cell etc. is determined as a good product. (I) A battery pack including the cell etc. determined as the good product is manufactured.

4 Claims, 6 Drawing Sheets

(51) Int. Cl.
*H01M 10/6555* (2014.01)
*H01M 2/10* (2006.01)
*H01M 4/485* (2010.01)
*H01M 10/04* (2006.01)
*H01M 10/44* (2006.01)
*H01M 10/48* (2006.01)
*H01M 10/54* (2006.01)
*G01R 31/392* (2019.01)
*H01M 10/42* (2006.01)
*H01M 10/34* (2006.01)

(52) U.S. Cl.
CPC ....... *H01M 4/485* (2013.01); *H01M 10/0459* (2013.01); *H01M 10/44* (2013.01); *H01M 10/48* (2013.01); *H01M 10/54* (2013.01); *H01M 10/6555* (2015.04); *H01M 10/345* (2013.01); *H01M 2010/4271* (2013.01); *Y02W 30/84* (2015.05)

(58) Field of Classification Search
CPC .. H01M 10/54; H01M 10/6555; H01M 10/44; Y02W 30/84
USPC .......................................... 324/432
See application file for complete search history.

(56) References Cited

U.S. PATENT DOCUMENTS

| | | | | |
|---|---|---|---|---|
| 2004/0259000 A1* | 12/2004 | Adachi | ............ | H01M 10/0525 429/306 |
| 2009/0104510 A1* | 4/2009 | Fulop | ............ | H01M 2/30 429/50 |
| 2009/0284226 A1 | 11/2009 | Komori et al. | | |
| 2010/0090650 A1* | 4/2010 | Yazami | ............ | H01M 10/443 320/132 |
| 2011/0112782 A1* | 5/2011 | Majima | ............ | H01M 10/48 702/63 |
| 2011/0213509 A1* | 9/2011 | Onnerud | ............ | H01M 2/1077 700/297 |
| 2012/0182020 A1 | 7/2012 | Akutsu et al. | | |
| 2012/0200266 A1* | 8/2012 | Berkowitz | ............ | H01M 10/44 320/139 |
| 2012/0303208 A1* | 11/2012 | Hariharan | ............ | H01M 10/48 701/32.9 |
| 2013/0022860 A1* | 1/2013 | Minoura | ............ | H01M 4/14 429/163 |
| 2013/0057291 A1* | 3/2013 | Takahashi | ............ | H01M 2/1072 324/427 |
| 2013/0076363 A1* | 3/2013 | Takahashi | ............ | H01M 10/48 324/427 |
| 2013/0278221 A1* | 10/2013 | Maeda | ............ | B60L 3/0046 320/134 |
| 2014/0159664 A1 | 6/2014 | Yoshida | | |
| 2014/0203783 A1* | 7/2014 | Kiesel | ............ | H01M 10/42 320/134 |
| 2014/0218042 A1* | 8/2014 | Koba | ............ | G01R 31/389 324/430 |
| 2015/0145521 A1 | 5/2015 | Koba et al. | | |
| 2015/0280290 A1* | 10/2015 | Saha | ............ | H01M 10/48 429/50 |
| 2015/0340888 A1* | 11/2015 | Hofer | ............ | H01M 10/425 320/116 |
| 2015/0377976 A1* | 12/2015 | Maluf | ............ | H02J 7/0047 702/63 |
| 2016/0011274 A1* | 1/2016 | Morita | ............ | B60L 58/16 702/63 |

FOREIGN PATENT DOCUMENTS

| | | |
|---|---|---|
| JP | 2001-286076 A | 10/2001 |
| JP | 2002-171684 A | 6/2002 |
| JP | 2004-328902 A | 11/2004 |
| JP | 2008-235036 A | 10/2008 |
| JP | 2009-277627 A | 11/2009 |
| JP | 2011-171032 A | 9/2011 |
| JP | 2011-216328 A | 10/2011 |
| JP | 2011-252930 A | 12/2011 |
| JP | 2014-2009 A | 1/2014 |
| JP | 2015-103387 A | 6/2015 |
| JP | 2015-204151 A | 11/2015 |
| WO | 2013/008409 A1 | 1/2013 |
| WO | 2015/155584 A1 | 10/2015 |

\* cited by examiner

METHOD OF MANUFACTURING BATTERY PACK

This nonprovisional application is based on Japanese Patent Application No. 2016-159111 filed with the Japan Patent Office on Aug. 15, 2016, the entire contents of which are hereby incorporated by reference.

BACKGROUND

Field

The present disclosure relates to a method of manufacturing a battery pack.

Description of the Background Art

Japanese Patent Laying-Open No. 2011-216328 discloses collection of a cell or a battery module from a used battery pack, screening of cells or battery modules through prescribed inspection of characteristics, and re-manufacturing of a battery pack with the screened cell or battery module.

SUMMARY

A battery pack is used, for example, as a power supply for an electric vehicle, an electrically powered device, and a portable device. The battery pack refers to one set of batteries constituted in such a manner that two or more cells or battery modules are connected in series or in parallel. The battery module refers to a battery constituted in such a manner that two or more cells are joined, and it is a basic unit of a battery pack.

The battery pack gradually becomes lower in performance as it is used. Lowering in performance of the battery pack reflects lowering in performance of the cell or the battery module included in the battery pack. Lowering in performance of individual cells or battery modules included in one set of battery pack, however, is not uniform. In the used battery pack, progress of lowering in performance is varied among cells or battery modules. Therefore, cells or battery modules which can still last may also be included in a battery pack which has been determined to be replaced due to its lifetime.

A "cell or battery module" below may be abbreviated as a "cell etc."

Japanese Patent Laying-Open No. 2011-216328 discloses collection of a cell etc. from a used battery pack, screening of the cell etc. which can be used through inspection of characteristics, and remanufacturing of a battery pack with the screened cell etc. Such a manner is desirable from a point of view of effective use of resources.

Japanese Patent Laying-Open No. 2011-216328 employs an open circuit voltage (OCV) as the reference for screening of a cell etc. If an open circuit voltage at the time of collection is simply defined as the reference, a cell etc. of which performance has apparently lowered may be rejected as a defective product.

The "cell etc. of which performance has apparently lowered" refers to a cell etc. which can be recovered although an open circuit voltage thereof at the time of collection is lower than a lower limit voltage of the cell etc. If the cell etc. is a nickel-metal hydride battery, such apparent lowering in performance particularly tends to occur due to self-discharge. A cell etc. of which performance has apparently lowered can be recovered, for example, by performing full-range charging and discharging. A "cell etc. of which performance has truly lowered" refers to a cell etc. of which open circuit voltage at the time of collection is lower than the lower limit voltage of the cell etc. and which cannot be recovered. In a cell etc. of which performance has truly lowered, for example, irreversible change in structure may have occurred in an electrode active material.

If a long time can be spent for inspection, a cell etc. of which performance has apparently lowered and a cell etc. of which performance has truly lowered can be distinguished from each other. Namely, a cell etc. is left for a long period and an amount of lowering in open circuit voltage as a result of the cell etc. being left (an amount of voltage lowering) is measured. A difference between a cell etc. of which performance has apparently lowered and a cell etc. of which performance has truly lowered tends to be exhibited in an amount of voltage lowering. As a time period for inspection is longer, however, efficiency in production of battery packs is naturally lower.

An object of the present disclosure is to efficiently manufacture a battery pack by detecting a cell etc. of which performance has truly lowered in a short period.

Technical features and effects of the present disclosure will be described below. A mechanism of action in the present disclosure, however, includes presumption. The scope of the present disclosure should not be limited by whether the mechanism of action is right or wrong.

[1] A method of manufacturing a battery pack according to the present disclosure includes (A) to (I) below:

(A) preparing a used battery pack;

(B) collecting a cell or a battery module from the used battery pack by disassembling the used battery pack, the cell and the battery module each being a nickel-metal hydride battery;

(C) adjusting a state of charge of the collected cell or battery module to a state of charge within any of a first range of the state of charge not lower than 0% and lower than 3%, a second range of the state of charge not lower than 3% and not higher than 20%, and a third range of the state of charge not lower than 100% and not higher than 200%;

(D) measuring a first open circuit voltage of the cell or the battery module of which state of charge has been adjusted;

(E) leaving the cell or the battery module of which first open circuit voltage has been measured for a prescribed period;

(F) measuring a second open circuit voltage of the cell or the battery module after the cell or the battery module is left;

(G) calculating an amount of voltage lowering as a result of the cell or the battery module being left by subtracting the second open circuit voltage from the first open circuit voltage;

(H) determining the cell or the battery module as a good product when the amount of voltage lowering is equal to or smaller than a reference value set in advance; and (I) manufacturing a battery pack including the cell or the battery module determined as the good product.

The manufacturing method according to the present disclosure is directed to a nickel-metal hydride battery. The manufacturing method according to the present disclosure is characterized by a range of a state of charge (SOC) in which an amount of voltage lowering ($\Delta V$) is measured. As shown in (C), in measurement of an amount of voltage lowering, an SOC of a cell etc. is adjusted to an SOC within any of a first SOC range (0 to 3%), a second SOC range (3 to 20%), and a third SOC range (100 to 200%). By measuring an amount of voltage lowering from an SOC in these SOC ranges, a cell etc. of which performance has truly lowered can be detected in a short period.

A cell etc. of which performance has apparently lowered and a cell etc. of which performance has not lowered may collectively be referred to as a "good product" below. A "cell etc. of which performance has not lowered" refers to a cell etc. having a normal open circuit voltage and having performance maintained within an allowable range, among cells etc. collected from a used battery pack. A cell etc. of which performance has truly lowered may be referred to as a "defective product."

FIG. 4 shows a charging profile of a nickel-metal hydride battery. A cell etc. has been known to self-discharge as it is left. Self-discharge means natural lowering in SOC of a cell etc. With lowering in SOC of a cell etc., a voltage of the cell etc. also lowers along a curve in FIG. 4.

A cell etc. of which performance has truly lowered (a defective product) is higher in rate of lowering in SOC (rate of self-discharge) as a result of the cell etc. being left. An amount of voltage lowering, however, has conventionally been measured in an SOC range in which a cell etc. is used (approximately from 40 to 80%). Therefore, for example, even though a difference in SOC by approximately 10% may be caused between two cells etc. due to a difference in rate of self-discharge, a difference between two cells etc. in voltage and an amount of voltage lowering is merely small. Therefore, a long period (for example, approximately one month) is required by the time a significant difference is exhibited between an amount of voltage lowering in a good product and an amount of voltage lowering in a defective product.

In contrast, in the present disclosure, an amount of voltage lowering from an SOC within the first SOC range (0 to 3%), the second SOC range (3 to 20%), or the third SOC range (100 to 200%) is measured. As shown in FIG. 4, an inclination of the curve is steeper in these SOC ranges than in the SOC range in which the cell etc. is used (40 to 80%). Therefore, in these SOC ranges, a voltage is significantly lowered even by slight self-discharge (lowering in SOC). It is thus estimated that a significant difference between an amount of voltage lowering in a good product and an amount of voltage lowering in a defective product is exhibited in a short period. Namely, a cell etc. of which performance has truly lowered can be detected in a short period. According to the manufacturing method in the present disclosure, it is expected that a period until a significant difference between a good product and a defective product is exhibited is shortened, for example, to 7 days or shorter. Since whether or not a product is defective is determined in such a short period, battery packs can efficiently be manufactured.

Furthermore, if an SOC of a cell etc. is adjusted to an SOC within the first SOC range (0 to 3%) and the second SOC range (3 to 20%), it is expected that a discharging memory will dissolve in the cell etc. which is a good product during a period in which the cell etc. is left. The "discharging memory" refers to a kind of a memory phenomenon in which a voltage during discharging tends to lower than in a normal condition. If the discharging memory occurs, a discharged capacity of a cell etc. will lower.

If an SOC of a cell etc. is adjusted to an SOC within the third SOC range (100 to 200%), it is expected that a charging memory will dissolve in the cell etc. which is a good product during a period in which the cell etc. is left. The "charging memory" refers to a kind of a memory phenomenon in which a voltage during charging tends to rise more than in a normal condition. If the charging memory occurs, a charging capacity of a cell etc. will lower.

In a cell etc. of which performance has apparently lowered, hydrogen in an amount exceeding an expected amount may have leaked from a hydrogen storage alloy representing a negative electrode active material. Performance may have apparently lowered (lowering in voltage or capacity) for this reason. By charging a cell etc. to an SOC within the third SOC range (100 to 200%), that is, by overcharging the cell etc., water contained in an electrolyte (an alkaline aqueous solution) is electrolyzed and hydrogen is generated. Generated hydrogen is absorbed in the hydrogen storage alloy. Consequently, the negative electrode active material from which hydrogen has escaped can be recovered.

According to the manufacturing method in the present disclosure, a cell etc. of which performance has apparently lowered can thus also be recovered while a cell etc. of which performance has truly lowered is detected.

[2] When the SOC of the cell etc. is adjusted to a state of charge within the third SOC range (100 to 200%) in (C), accuracy in detection of a defective product can also be enhanced as follows.

When the state of charge of the collected cell or battery module is adjusted to a state of charge within the third range of the state of charge, the manufacturing method according to the present disclosure preferably further includes (c1) and (c2) below:

(c1) monitoring a rate of increase in temperature of the cell or the battery module during charging; and (c2) determining the cell or the battery module as the good product when the rate of increase in temperature is equal to or smaller than a reference value set in advance.

A cell etc. of which performance has truly lowered (defective product) tends to generate heat when it is charged to a high SOC. A cause for heat generation may be, for example, increase in electrode reaction resistance brought about by deterioration of an electrode active material. Then, by monitoring a rate of increase in temperature of a cell etc. in charging to an SOC within the third SOC range (100 to 200%), a cell etc. exhibiting abnormal heat generation can be detected. As the manufacturing method according to the present disclosure further includes determination as to whether a cell etc. is defective based on a rate of increase in temperature, improvement in accuracy in detection of a cell etc. of which performance has truly lowered is expected.

[3] When the SOC of the cell etc. is adjusted to an SOC within the first SOC range (0 to 3%) in (C), a manner below is preferred.

When the state of charge of the collected cell or battery module is adjusted to a state of charge within the first range of the state of charge, the manufacturing method according to the present disclosure preferably further includes (K) charging the cell or the battery module determined as the good product to a state of charge not lower than 100% before (I) manufacturing of the battery pack including the cell or the battery module determined as the good product.

As shown in FIG. 4, an inclination of a charging curve is particularly steep in the first SOC range (0 to 3%). Therefore, a difference in amount of voltage lowering from an SOC within the first SOC range (0 to 3%) between a good product and a defective product is exhibited more noticeably.

Since a voltage is low in the first SOC range (0 to 3%), hydrogen may leak from the negative electrode active material in a good product during a period in which the cell etc. is left. If hydrogen in an amount exceeding an expected amount leaks from the negative electrode active material as described previously, apparent lowering in capacity or the like may take place. Therefore, a good product is once overcharged before manufacturing of a battery pack. The negative electrode active material can thus be filled with hydrogen generated as a result of decomposition of an electrolyte. The negative electrode active material from which hydrogen has leaked can thus be recovered.

In the manufacturing method in [3], a final good product have experienced both of the SOC lower than 3% and the SOC not lower than 100%. Therefore, in the good product it is expected that both of the discharging memory and the charging memory have dissolved.

In the manufacturing method in [3], a good product is overcharged after a defective product (that is, a cell etc. which may generate heat during overcharging) is eliminated as a result of determination based on an amount of voltage lowering. Therefore, necessity to monitor a rate of increase in temperature during overcharging is low. Therefore, in the manufacturing method in [3], a charging and discharging apparatus not provided with a temperature monitoring function can be employed. It is expected that more simplified production facilities are used in the manufacturing method in [3] than in the manufacturing method in [2].

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Embodiments (a first embodiment to a third embodiment) of the present disclosure will be described below. The embodiments below, however, do not limit the scope of the present disclosure.

First Embodiment

Figure 1:
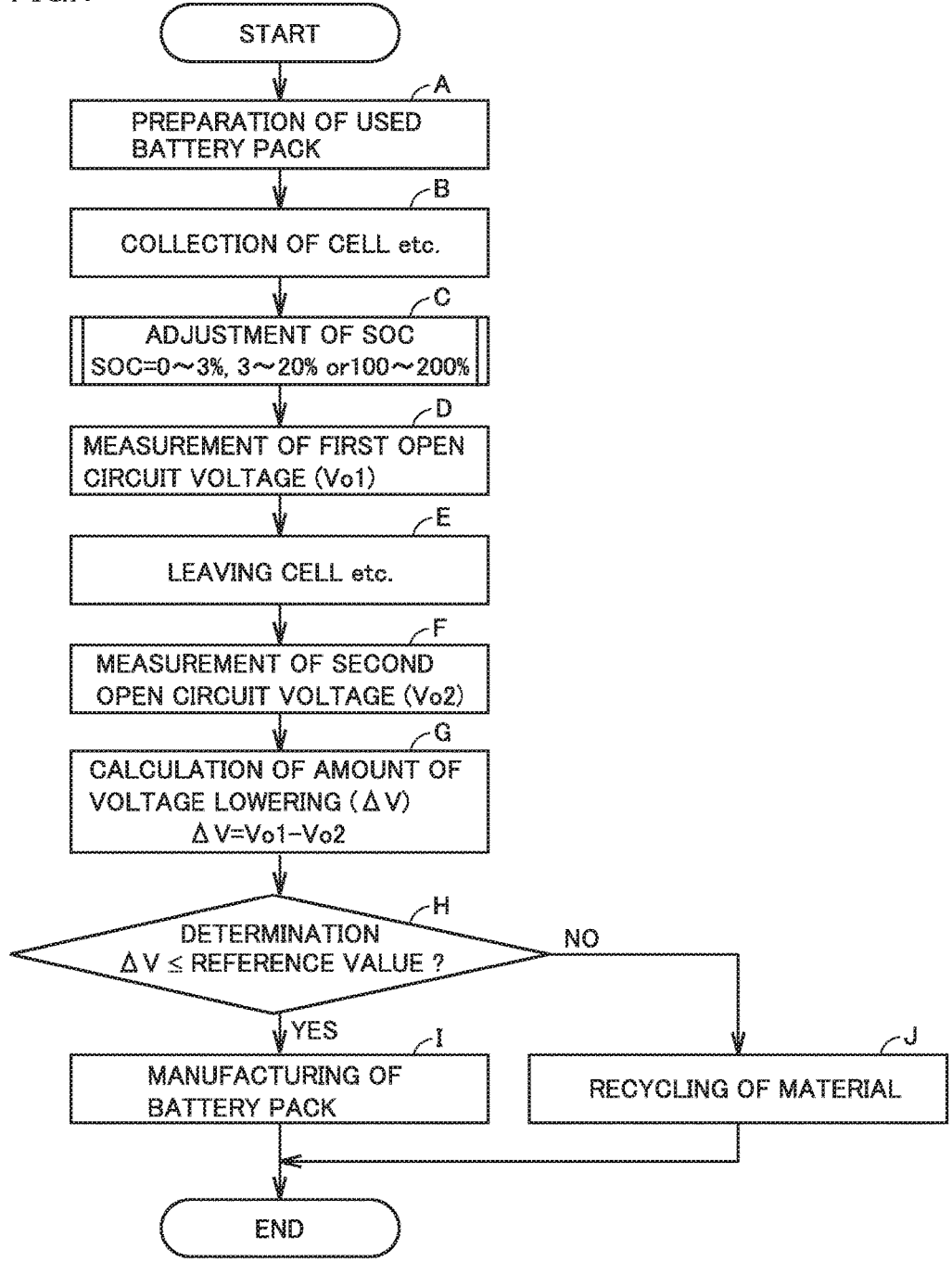
FIG. 1 is a flowchart showing overview of a method of manufacturing a battery pack according to a first embodiment.

FIG. 1 is a flowchart showing overview of a method of manufacturing a battery pack according to a first embodiment. The manufacturing method according to the first embodiment includes (A) preparation of a used battery pack, (B) collection of a cell etc., (C) adjustment of an SOC, (D) measurement of a first open circuit voltage, (E) leaving the cell etc., (F) measurement of a second open circuit voltage, (G) calculation of an amount of voltage lowering, (H) determination, (I) manufacturing of a battery pack, and (J) recycling of a material.

The manufacturing method according to the first embodiment will sequentially be described below.

<<(A) Preparation of Used Battery Pack>>

The manufacturing method according to the first embodiment includes (A) preparation of a used battery pack.

Used battery packs are available from users. For example, battery packs for hybrid vehicles can be collected in periodical inspection or the like of vehicular main bodies.

The "used battery pack" herein refers to a battery pack with a record of mount on an actual apparatus. So long as the battery pack has a record of mount on an actual apparatus, it is regarded as being used regardless of the number of times of use. Examples of the actual apparatus include an electric vehicle, a hybrid vehicle, an electrically powered tool, a portable device, a home energy management system (HEMS), a plant power storage system, and a stationary emergency power supply.

<<(B) Collection of Cell Etc.>>

The manufacturing method according to the first embodiment includes (B) collection of a cell or a battery module from the used battery pack by disassembling the used battery pack.

Inspection of appearance, inspection of a mass, or the like of the battery pack may be conducted before the battery pack is disassembled. Whether to collect a cell or a battery module from a battery pack is determined, for example, based on ease in disassembly or ease in remanufacturing (reassembly).

Figure 5:
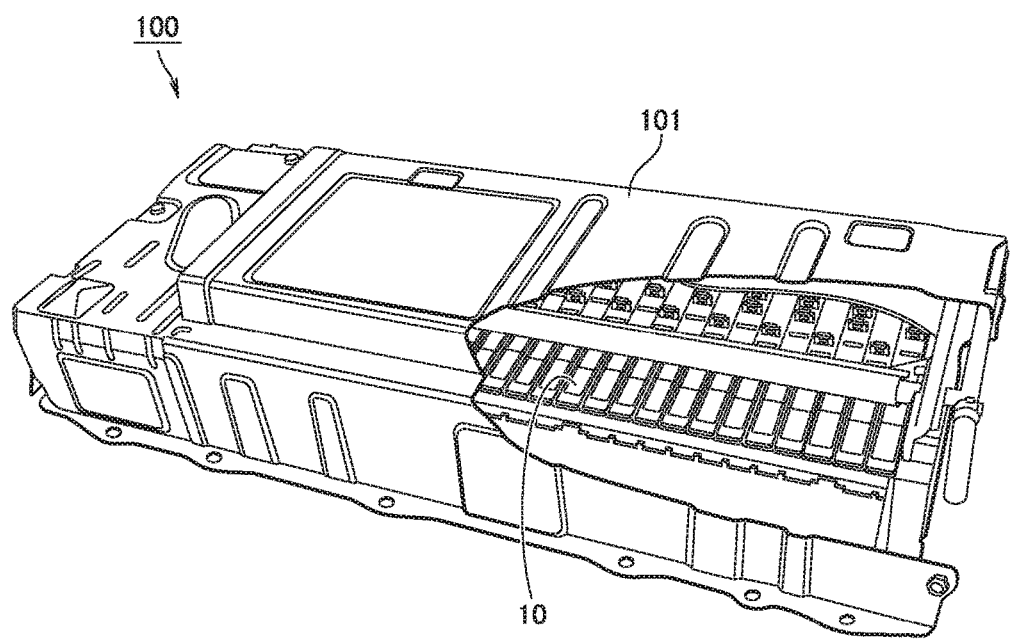
FIG. 5 is a schematic diagram showing one example of a battery pack.

FIG. 5 is a schematic diagram showing one example of a battery pack. A battery pack 100 includes an accommodation box 101. A plurality of (two or more) battery modules 10 are accommodated in accommodation box 101. Battery modules 10 are connected in series or in parallel. The number of battery modules 10 included in battery pack 100 is determined by an output that is required or the like. In this example, 28 battery modules are accommodated in accommodation box 101. In accommodation box 101, in addition to battery module 10, a controller, a cooling apparatus, various sensors (a current sensor, a voltage sensor, a temperature sensor, and the like), a wire harness, and the like are accommodated.

Figure 6:
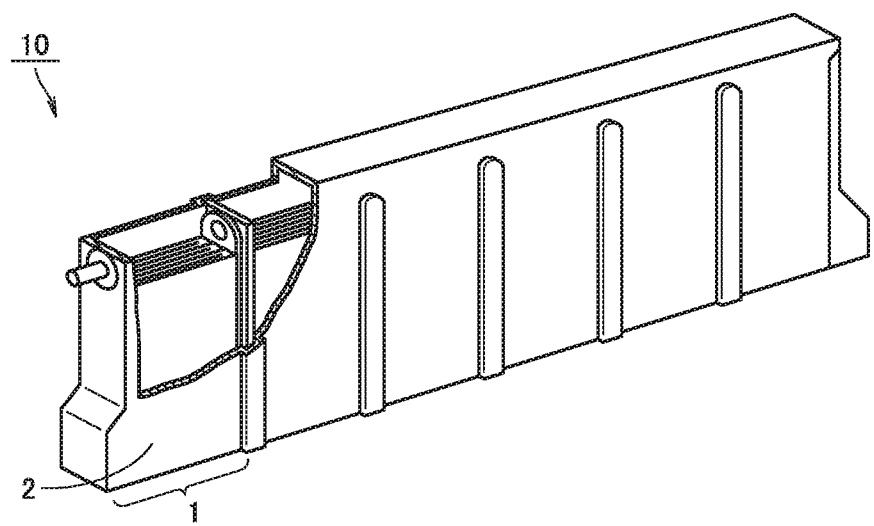
FIG. 6 is a schematic diagram showing one example of a battery module.

FIG. 6 is a schematic diagram showing one example of the battery module. Battery module 10 is configured in such a manner that a plurality of cells 1 are joined. In this example, battery module 10 is configured in such a manner that six cells 1 are joined.

Cell 1 has an outer geometry in a prismatic shape (a parallelepiped with a flat profile). Cell 1 includes a container 2. Container 2 accommodates a positive electrode plate, a separator, a negative electrode plate, and an electrolyte. The positive electrode plate contains at least one of nickel hydroxide and nickel oxyhydroxide. Nickel hydroxide is converted to nickel oxyhydroxide through charging and nickel oxyhydroxide is converted to nickel hydroxide through discharging. The negative electrode plate contains a hydrogen storage alloy. Cell 1 and battery module 10 are each a nickel-metal hydride battery. The separator is arranged between the positive electrode plate and the negative electrode plate. The separator may be made, for example, of a nonwoven fabric composed of polypropylene. An alkaline aqueous solution is employed as the electrolyte. For example, potassium hydroxide is employed as a dissolved substance.

The configuration of a cell etc. described here is merely by way of example. For example, a battery module may include a plurality of cylindrical cells. For example, a battery pack may include a plurality of cells which are not modularized.

<<(C) Adjustment of SOC>>

The manufacturing method according to the first embodiment includes (C) adjustment of a state of charge of the collected cell or battery module to a state of charge within any of a first range of the state of charge not lower than 0% and lower than 3%, a second range of the state of charge not lower than 3% and not higher than 20%, and a third range of the state of charge not lower than 100% and not higher than 200%.

The "state of charge (SOC)" herein refers to a ratio of a current charging capacity to a full charging capacity of a battery (a cell or a battery module). The state of charge of the cell etc. can be adjusted with a prescribed charging and discharging apparatus. The cell etc. may be charged or discharge, for example, in an environment at a room temperature (10 to 30° C.).

A target SOC may be achieved by charging or discharging. For example, when an SOC is adjusted to 110%, charging from an SOC lower than 110% directly to the SOC of 110% may be performed, or charging to 120% may once be performed and then discharging to 110% may be performed. Charging and discharging may be performed with any technique. Charging and discharging may be performed based on a constant current technique, a constant voltage technique, a constant power technique, or combination of the constant current technique and the constant voltage technique.

Used battery packs at various SOCs are collected from markets. Furthermore, SOCs of cells etc. included in one set of used battery packs may also be varied. Screening of cells etc. for each SOC requires man-hours. Then, prior to adjustment to a target SOC, a cell etc. desirably fully discharge once. As a result of full discharge of cells etc., the SOCs of the cells etc. become uniform. Thus, cells etc. collected in different states can be handled in the same way.

"Full discharge" refers to discharging until the SOC of 0% is achieved. Full discharge may be completed in one discharging or a plurality of times of discharging. For example, discharging to a lower limit voltage is performed at a current approximately as high as 3C, and thereafter discharging is suspended for a prescribed time period. After a voltage is recovered as a result of suspension, further discharging to the lower limit voltage may be performed at a low current not higher than 1C. A time period required for full discharging may become shorter through such stepwise discharging. "C" here represents a unit expressing magnitude of a current and represents magnitude of a current at which an SOC varies from 0% to 100% in charging for 1 hour.

Figure 4:
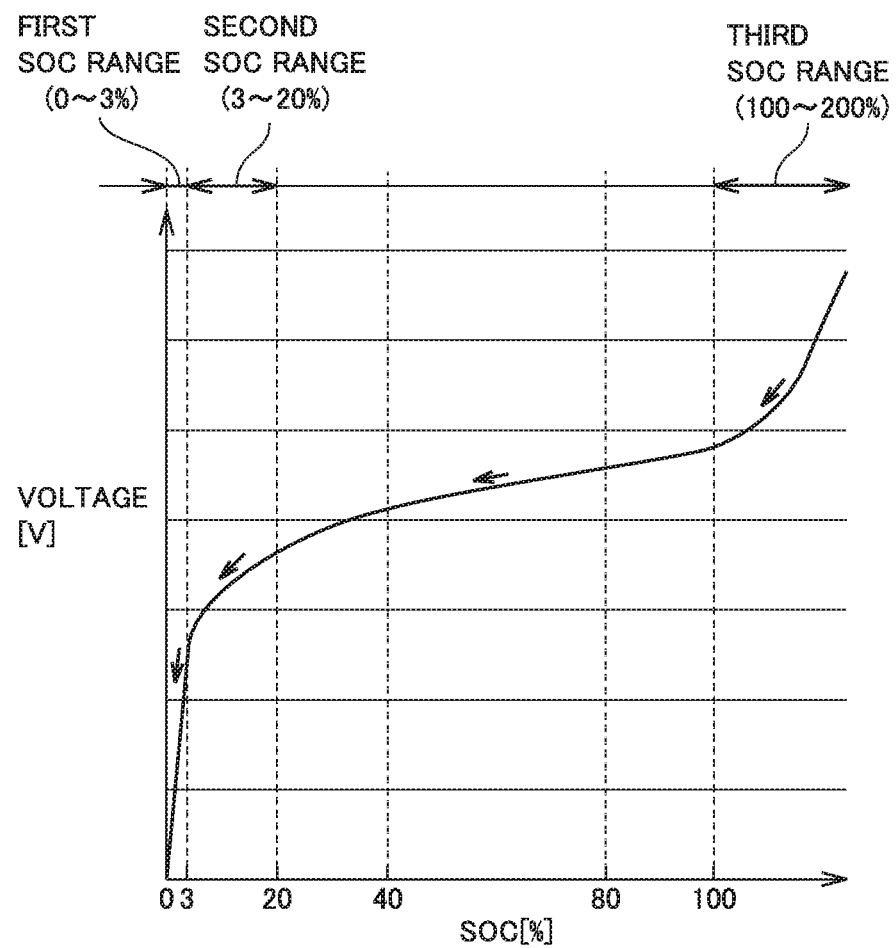
FIG. 4 shows a charging profile of a nickel-metal hydride battery.

As shown in the charging profile in FIG. 4, the charging curve is steep in the first SOC range (0 to 3%), the second SOC range (3 to 20%), and the third SOC range (100 to 200%). Therefore, a difference between a good product and a defective product is noticeably exhibited in a short period as an amount of voltage lowering ($\Delta V$) from an SOC within the SOC ranges is measured.

When an SOC of a cell etc. is adjusted to an SOC within the first SOC range (0 to 3%) and the second SOC range (3 to 20%), it is expected that the discharging memory has dissolved in the cell etc. which is a good product during a subsequent period in which the cell etc. is left. When an SOC of a cell etc. is adjusted to an SOC within the third SOC range (100 to 200%), it is expected that the charging memory has dissolved in the cell etc. which is a good product during a subsequent period in which the cell etc. is left.

<<(D) Measurement of First Open Circuit Voltage>>

The manufacturing method according to the first embodiment includes (D) measurement of a first open circuit voltage of the cell or the battery module of which state of charge has been adjusted.

The first open circuit voltage ($Vo1$) may be measured with a prescribed voltage measurement apparatus. A prescribed period during which the cell etc. is left may be set between adjustment to each state of charge and measurement of the first open circuit voltage because an open circuit voltage may be unstable immediately after end of charging and discharging.

<<(E) Leaving>>

The manufacturing method according to the first embodiment includes (E) leaving the cell or the battery module of which first open circuit voltage has been measured for a prescribed period.

The cell or the battery module is left, for example, in an environment at a room temperature (10 to 30° C.). The manufacturing method according to the first embodiment can be expected to achieve a shorter period of the cell etc. being left. A period during which the cell etc. is left is set, for example, approximately to 1 to 14 days (typically, not shorter than 2 days and not longer than 7 days). Depending on the specifications of a cell etc., an optimal period during which the cell etc. is left (that is, a period in which a difference in amount of voltage lowering tends to be exhibited) may vary. The period during which the cell etc. is left is desirably determined by conducting preparatory experiments.

<<(F) Measurement of Second Open Circuit Voltage>>

The manufacturing method according to the first embodiment includes (F) measurement of a second open circuit voltage of the cell or the battery module after it is left.

The second open circuit voltage ($Vo2$) is measured also with a prescribed voltage measurement apparatus.

<<(G) Calculation of Amount of Voltage Lowering>>

The manufacturing method according to the first embodiment includes (G) calculation of an amount of voltage lowering as a result of the cell or the battery module being left by subtracting the second open circuit voltage from the first open circuit voltage.

An amount of voltage lowering ($\Delta V$) is calculated in an expression below:

$$\Delta V = Vo1 - Vo2.$$

<<(H) Determination>>

The manufacturing method according to the first embodiment includes (H) determination of the cell or the battery module as a good product when an amount of voltage lowering is equal to or smaller than a reference value set in advance.

A cell etc. of which amount of voltage lowering ($\Delta V$) is remarkably great is considered as a cell etc. of which performance has truly lowered (defective product). A statistical approach may be used for determining a reference value for $\Delta V$. For example, a statistic of $\Delta V$ (for example, a minimal value, an average value, or a mode value) is obtained by measuring a plurality of $\Delta V$s of cells etc. of which performance has truly lowered in advance. For example, a value calculated by multiplying a minimal value for $\Delta V$ of a cell etc. of which performance has truly lowered by a prescribed factor of safety (a coefficient smaller than 1) may be defined as the reference value. Naturally, in determining the reference value, a statistic of $\Delta V$ of a cell etc. confirmed as a good product (for example, a maximal value, an average value, or a mode value) is also taken into account.

A cell etc. of which ΔV exceeds the reference value is determined as a defective product. On the other hand, a cell etc. of which ΔV is equal to or smaller than the reference value is determined as a good product. After determination is made, the SOC of the good product can be adjusted to an SOC suitable for (I) manufacturing of a battery pack. In (C) adjustment of an SOC, when the SOC of the cell etc. has been adjusted to an SOC within the first SOC range (0 to 3%) or the third SOC range (100 to 200%), before (I) manufacturing of a battery pack, the SOC of the good product may be adjusted, for example, approximately to 3 to 50%. When the SOC of the cell etc. is adjusted to an SOC within the second SOC range (3 to 20%), it may not be substantially necessary to adjust the SOC again. Therefore, in (C) adjustment of an SOC, by selecting the SOC within the second SOC range (3 to 20%), the man-hours may be reduced as compared with an example in which an SOC within the first SOC range (0 to 3%) and the third SOC range (100 to 200%) is selected.

<<(I) Manufacturing of Battery Pack>>

The manufacturing method according to the first embodiment includes (I) manufacturing of a battery pack including the cell or the battery module determined as the good product.

A battery pack identical in model to the collected battery pack or a battery pack different in model from the collected battery pack may be manufactured. A battery pack may include only recycled cells (cells etc. determined as good products in the first embodiment) or include both of recycled cells etc. and unused cells etc.

<<(J) Recycling of Material>>

The manufacturing method according to the first embodiment includes (J) collection of a material from the cell or the battery module determined as the defective product.

A cell etc. determined as a defective product is considered as unrecoverable. From a point of view of effective use of resources, however, a defective product is desirably disassembled for collection of various materials, instead of simply being discarded. For example, such a rare metal as nickel or cobalt can be collected from a nickel-metal hydride battery. The collected material is used for manufacturing of a new cell etc. or manufacturing of another product.

When a battery module is determined as a defective product, good cells may also be collected by collecting a plurality of cells from the battery module and performing again the process from (C) adjustment of an SOC to (H) determination on the plurality of cells.

As set forth above, according to the manufacturing method in the first embodiment, a cell etc. of which performance has truly lowered is detected in a short period so that battery packs can efficiently be manufactured.

Second Embodiment

A second embodiment will be described below.

A manufacturing method according to the second embodiment is characterized in that (C) adjustment of an SOC in FIG. 1 includes determination. The second embodiment is otherwise the same as the first embodiment described previously. Therefore, the same description will not be repeated here.

<<(C) Adjustment of SOC>>

Figure 2:
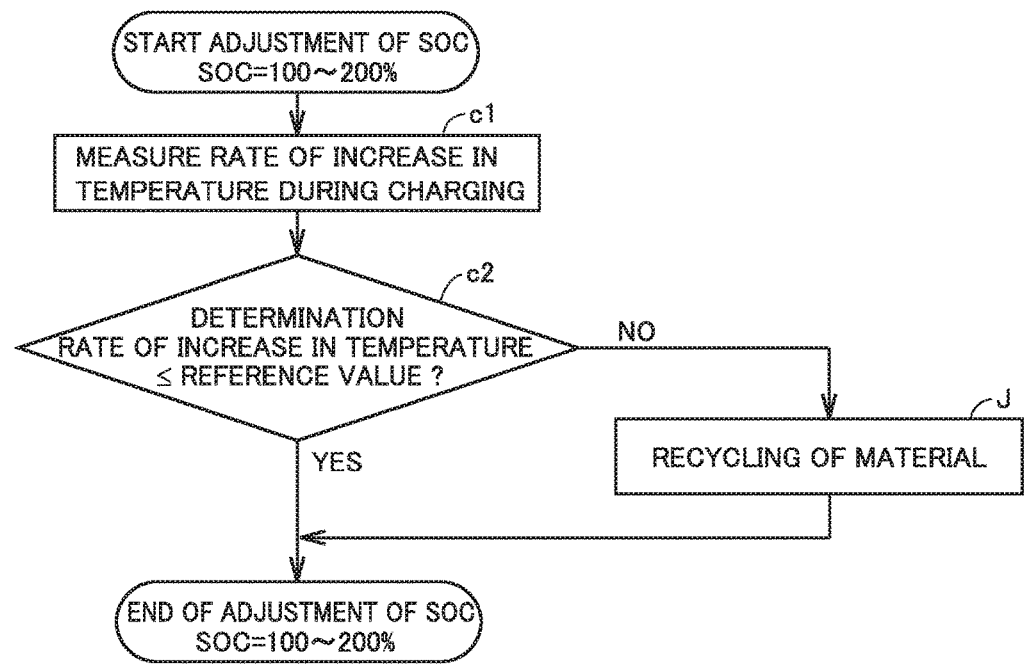
FIG. 2 is a flowchart showing a main part of a method of manufacturing a battery pack according to a second embodiment.

FIG. 2 is a flowchart showing a main part of the method of manufacturing a battery pack according to the second embodiment. According to the manufacturing method in the second embodiment, (C) adjustment of an SOC includes (c1) monitoring of a rate of increase in temperature during charging and (c2) determination. The main part of the manufacturing method according to the second embodiment will sequentially be described below.

According to the manufacturing method in the second embodiment, an SOC of a collected cell or battery module is adjusted to an SOC within the third SOC range (100 to 200%).

<<(c1) Monitoring of Rate of Increase in Temperature During Charging>>

The manufacturing method according to the second embodiment includes (c1) monitoring of a rate of increase in temperature of a cell or a battery module during charging.

Charging in accordance with a constant current technique is desirably adopted here, because, with variation in magnitude of a current, a rate of increase in temperature may also vary. A temperature of a cell etc. can be measured, for example, by attaching a thermocouple to an outer surface of a container. A temperature may be measured at a plurality of locations. As a temperature of a cell etc. is differentiated with respect to time, a rate of increase in temperature is calculated.

<<(c2) Determination>>

The manufacturing method according to the second embodiment includes (c2) determining the cell or the battery module as the good product when a rate of increase in temperature is equal to or smaller than a reference value set in advance.

Normally, when a charging current is constant, a rate of increase in temperature of a cell etc. is substantially constant or gradually increases. In a cell etc. of which performance has truly lowered, however, a rate of increase in temperature may abruptly increase due to abnormal heat generation. Therefore, by providing a reference value (an upper limit value) for the rate of increase in temperature, a cell etc. exhibiting abnormal heat generation can be detected in an early stage.

A statistical approach may be used for determining the reference value (upper limit value) for a rate of increase in temperature. For example, by measuring a plurality of rates of increase in temperature of cells etc. which have been confirmed as good products in advance and cells etc. confirmed as defective products, a statistic (for example, a maximal value, an average value, or a mode value) of the rate of increase in temperature of good products and a statistic (for example, a minimal value, an average value, or a mode value) of the rate of increase in temperature of defective products are obtained. For example, a value calculated by multiplying a minimal value of the rate of increase in temperature of the defective product by a prescribed factor of safety may be defined as the reference value. In determining the reference value, a statistic (for example, a maximal value, an average value, or a mode value) of the rate of increase in temperature of a cell etc. confirmed as a good product may be taken into account here again.

In the manufacturing method according to the second embodiment, at the time point when the rate of increase in temperature of a cell etc. exceeds the reference value during charging, charging of the cell etc. may be stopped (that is, that cell etc. is determined as a defective product) and the cell etc. may be replaced with another cell etc. According to such a manner, an amount of processing performed by the charging and discharging apparatus (throughput) is expected to improve.

As shown in FIG. 1, a cell etc. determined as a good product is fed to (D) measurement of a first open circuit voltage. A cell etc. determined as a defective product is fed to (J) recycling of a material. As the method of manufacturing a battery pack includes determination based on a rate of increase in temperature, improvement in accuracy in detection of a cell etc. of which performance has truly lowered is expected. As primary screening of cells etc. is performed in an upstream stage in a manufacturing flow, improvement in efficiency in production of battery packs is also expected. The number of defective products fed to an operation requiring a long retention time ((E) leaving) is reduced.

Third Embodiment

A third embodiment will be described below.

Figure 3:
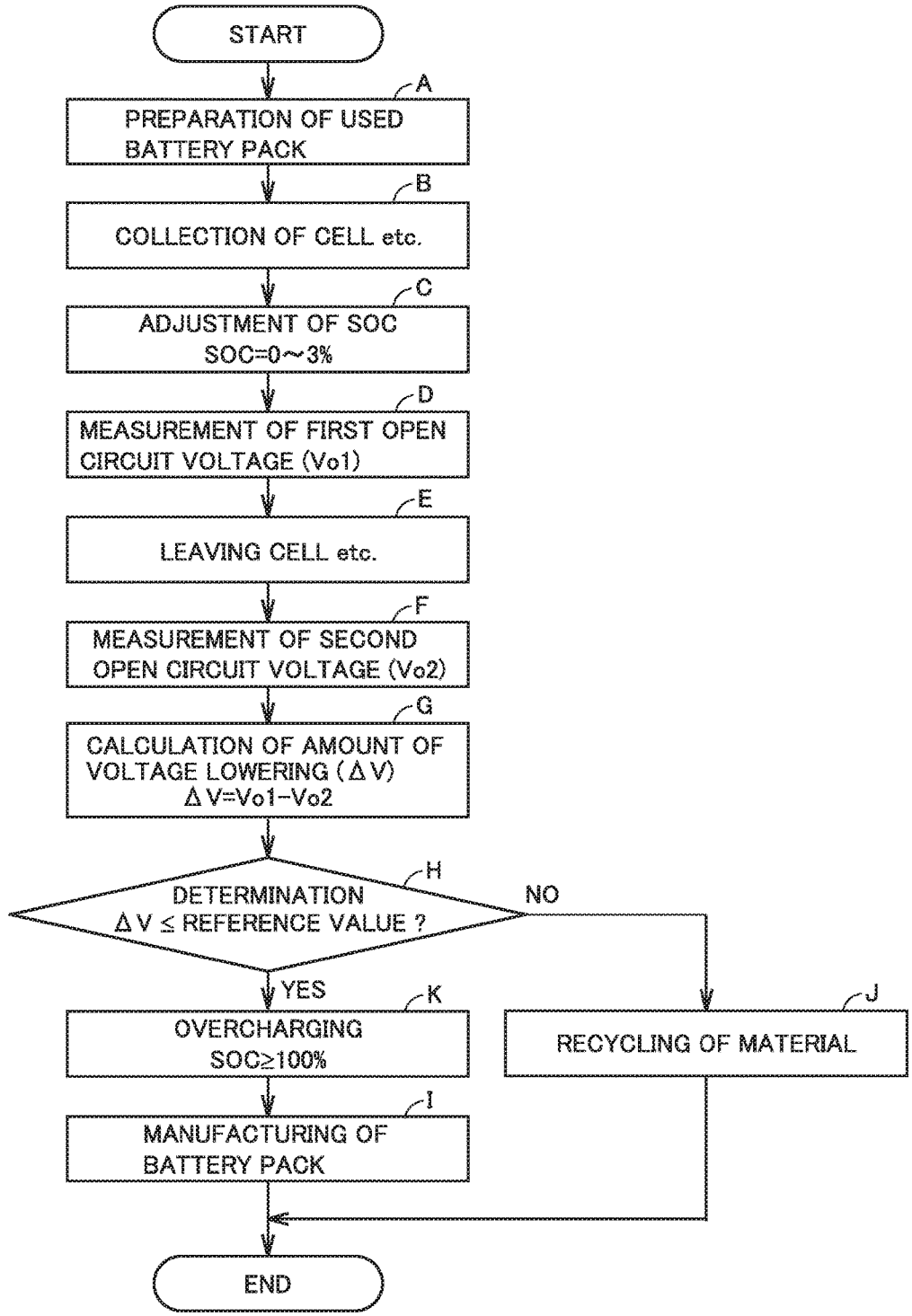
FIG. 3 is a flowchart showing overview of a method of manufacturing a battery pack according to a third embodiment.

FIG. 3 is a flowchart showing overview of a method of manufacturing a battery pack according to the third embodiment. The manufacturing method according to the third embodiment is characterized by adjustment of a cell etc. to an SOC within the first SOC range (0 to 3%) in (C) adjustment of an SOC and (K) overcharging of the cell etc. after (H) determination. The third embodiment is otherwise the same as the first embodiment described previously. Therefore, the same description will not be repeated here.

<<(C) Adjustment of SOC>>

According to the manufacturing method in the third embodiment, a state of charge of the collected cell or battery module is adjusted to a state of charge within the first range of the state of charge.

The charging curve of the nickel-metal hydride battery is particularly steep in the first SOC range (0 to 3%). Therefore, a difference in ΔV between a good product and a defective product is exhibited more noticeably as a result of measurement of ΔV from an SOC within the first SOC range (0 to 3%). Thus, decrease in period during which the cell or the battery module is left and improvement in accuracy in detection of a defective product are expected.

<<(K) Overcharging>>

The manufacturing method according to the third embodiment includes (K) charging the cell or the battery module determined as the good product to a state of charge not lower than 100% before (I) manufacturing of a battery pack including the cell or the battery module determined as the good product.

As set forth above, by measuring ΔV from the SOC within the first SOC range (0 to 3%), improvement in accuracy in detection of a defective product or the like is expected. Since a voltage is low within the first SOC range (0 to 3%), hydrogen may leak from the negative electrode active material of the good product.

In the third embodiment, in order to compensate for leakage of hydrogen, a cell etc. is overcharged after (H) determination and before (I) manufacturing of a battery pack. Thus, the negative electrode active material can be filled with hydrogen generated as a result of decomposition of an electrolyte. The SOC reached during charging here is not particularly restricted so long as the SOC is equal to or higher than 100%. If the reached SOC is excessively high, however, an internal pressure in a cell may increase due to generation of a hydrogen gas. The reached SOC is set, for example, to 200% or lower and preferably 150% or lower.

In the manufacturing method according to the third embodiment, after a cell etc. (a defective product) which may generate heat at a high SOC is eliminated as a result of (H) determination, a cell etc. determined as a good product is subjected to (K) overcharging. Therefore, necessity to monitor a rate of increase in temperature of the cell etc. during overcharging is low. Therefore, according to the manufacturing method in the third embodiment, a charging and discharging apparatus not provided with a temperature monitoring function may be employed. It is expected that more simplified production facilities are used in the manufacturing method according to the third embodiment than in the manufacturing method according to the second embodiment.

EXAMPLES

Experimental examples will be described below. Examples below do not limit the scope of the present disclosure.

<Sample 1>

Ten battery modules confirmed as good products based on an amount of voltage lowering (ΔV) from an SOC of 60% are prepared. The 10 battery modules will be referred to as a "good product group" below.

Ten battery modules of which performance was intentionally lowered through a severe cycle test are prepared. The 10 battery modules will be referred to as a "defective product group" below. The battery modules in the good product group and the battery modules in the defective product group are nickel-metal hydride batteries under the same specifications.

SOCs of the battery modules in the good product group and the defective product group are adjusted to 1% within the first SOC range (0 to 3%). After the SOCs are adjusted, first open circuit voltages of the battery modules in the good product group and the defective product group are measured. After the first open circuit voltages are measured, the battery modules in the good product group and the defective product group are left. An open circuit voltage (that is, a second open circuit voltage) is measured every day and an amount of voltage lowering (ΔV) is calculated each time.

A period until a difference by 300 mV appears between an average value of ΔV of the good product group and an average value of ΔV of the defective product group is counted. A difference by 300 mV here may be considered as a significant difference. Table 1 below shows results.

<Samples 2 to 4>

In samples 2 to 4, as shown in Table 1, a period until a difference by 300 mV appears between the average value of ΔV of the good product group and the average value of ΔV of the defective product group is counted in a procedure the same as in sample 1 except for change in SOC at the time of start of leaving of the battery module. Table 1 shows results.

TABLE 1

| | Sample 1 | Sample 2 | Sample 3 | Sample 4 |
|---|---|---|---|---|
| SOC at Start of Leaving of Battery Module | 1% (0 to 3%) | 10% (3 to 20%) | 150% (100 to 200%) | 60% |
| Period Until Difference by 300 mV Appears Between Average Value of ΔV of Good Product Group and Average Value of ΔV of Defective Product Group | 2 days | 7 days | 5 days | 36 days |

<Result>

As shown in Table 1, samples 1 to 3 are shorter than sample 4 in period until a significant difference appears between the average value of ΔV of the good product group and the average value of ΔV of the defective product group.

This may be because the charging curve of the nickel-metal hydride battery is steep within the SOC ranges to which samples 1 to 3 belong.

Though the embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

What is claimed is:

1. A method of manufacturing a battery pack comprising:
    collecting a cell or a battery module from a used battery pack by disassembling the used battery pack, the cell and the battery module each being a nickel-metal hydride battery;
    adjusting a state of charge of the collected cell or battery module to a state of charge within any of a first range of the state of charge not lower than 0% and lower than 3%, within a second range of the state of charge not lower than 3% and not higher than 20%, and within a third range of the state of charge not lower than 100% and not higher than 200%;
    measuring a first open circuit voltage of the cell or the battery module at the state of charge that has been adjusted to be within one of the first range of the state of charge, the second range of the state of charge, and the third range of the state of charge;
    leaving the cell or the battery module that been adjusted to be within the one of the first range of the state of charge, the second range of the state of charge, and the third range of the state of charge, for a prescribed period;
    measuring a second open circuit voltage of the cell or the battery module after the cell or the battery module is left for the prescribed period;
    calculating an amount of voltage lowering as a result of the cell or the battery module being left by subtracting the second open circuit voltage from the first open circuit voltage;
    determining the cell or the battery module as a good product when the amount of voltage lowering is equal to or smaller than a reference value set in advance; and
    manufacturing a battery pack including the cell or the battery module determined as the good product.

2. The method of manufacturing a battery pack according to claim 1, the method further comprising:
    when the state of charge of the collected cell or battery module is adjusted to a state of charge within the third range of the state of charge,
    monitoring a rate of increase in temperature of the cell or the battery module during charging; and
    determining the cell or the battery module as the good product when the rate of increase in temperature is equal to or smaller than a reference value set in advance.

3. The method of manufacturing a battery pack according to claim 1, the method further comprising:
    when the state of charge of the collected cell or battery module is adjusted to a state of charge within the first range of the state of charge, charging the cell or the battery module determined as the good product to a state of charge not lower than 100% before the battery pack including the cell or the battery module determined as the good product is manufactured.

4. The method of manufacturing a battery pack according to claim 1, wherein the prescribed period is not shorter than 2 days and not longer than 7 days.

* * * * *